United States Patent
Kakamu (10) Patent No.: US 9,065,462 B1
(45) Date of Patent: Jun. 23, 2015

(54) DIGITAL-TO-ANALOG CONVERSION CIRCUIT AND CORRECTION METHOD FOR DIGITAL-TO-ANALOG CONVERSION CIRCUIT

(71) Applicant: FUJITSU SEMICONDUCTOR LIMITED, Yokohama-shi, Kanagawa (JP)

(72) Inventor: Tomoya Kakamu, Gifu (JP)

(73) Assignee: FUJITSU SEMICONDUCTOR LIMITED, Yokohama (JP)

( * ) Notice: Subject to any disclaimer, the term of this patent is extended or adjusted under 35 U.S.C. 154(b) by 0 days.

(21) Appl. No.: 14/612,920

(22) Filed: Feb. 3, 2015

(30) Foreign Application Priority Data

Feb. 10, 2014 (JP) ................................ 2014-023539

(51) Int. Cl.
- H03M 1/06 (2006.01)
- H03M 1/70 (2006.01)
- H03M 1/00 (2006.01)
- H03M 1/66 (2006.01)

(52) U.S. Cl.
CPC .............. *H03M 1/0617* (2013.01); *H03M 1/70* (2013.01); *H03M 1/00* (2013.01); *H03M 1/66* (2013.01)

(58) Field of Classification Search
CPC ......... H03M 1/66; H03M 1/00; H03M 1/742; H03M 1/745; G09G 3/325; G09G 3/3241; G09G 3/3283
USPC ................................. 341/119–160
See application file for complete search history.

(56) References Cited

U.S. PATENT DOCUMENTS

| | | | |
|---|---|---|---|
| 5,055,844 A * | 10/1991 | Kasai | 341/144 |
| 5,446,457 A * | 8/1995 | Ryat | 341/136 |
| 5,703,586 A * | 12/1997 | Tucholski | 341/144 |
| 7,076,384 B1 * | 7/2006 | Radulov et al. | 702/85 |
| 7,466,252 B1 * | 12/2008 | Radulov et al. | 341/120 |
| 7,990,300 B2 | 8/2011 | Takiguchi | |
| 2012/0169383 A1 * | 7/2012 | Kakamu et al. | 327/117 |
| 2014/0354458 A1 * | 12/2014 | Kakamu | 341/122 |

FOREIGN PATENT DOCUMENTS

| | | |
|---|---|---|
| JP | 2010-136229 A | 6/2010 |
| JP | 2012-060618 A | 3/2012 |

OTHER PUBLICATIONS

Tao Chen et al., "A 14-bit 200-MHz Current-Steering DAC With Switching-Sequence Post-Adjustment Calibration" IEEE Journal of Solid-State Circuits, vol. 42, No. 11, Nov. 2007, pp. 2386-2394.

* cited by examiner

*Primary Examiner* — Lam T Mai
(74) *Attorney, Agent, or Firm* — Arent Fox LLP (57) ABSTRACT

A digital-to-analog conversion circuit includes first current sources weighted depending on lower-order bits of digital input signals and supplied with a first bias voltage and second current sources weighted depending on higher-order bits of the digital input signals and supplied with a second bias voltage. A reference current source circuit generates the first and second bias voltages based on a first reference current. An output circuit combines currents from the first and second current sources in accordance with the digital input signals to generate an output current, the currents from the first and second current sources being set according to the first reference current. A correction circuit changes the first reference current into a second reference current smaller than the first reference current, and adjusts the first and second bias voltages based on currents from the first and second current sources changed according to the second reference current.

12 Claims, 5 Drawing Sheets

DIGITAL-TO-ANALOG CONVERSION CIRCUIT AND CORRECTION METHOD FOR DIGITAL-TO-ANALOG CONVERSION CIRCUIT

CROSS-REFERENCE TO RELATED APPLICATIONS

This application is based upon and claims the benefit of priority from prior Japanese Patent Application No. 2014-023539, filed on Feb. 10, 2014, the entire contents of which are incorporated herein by reference.

FIELD

This disclosure relates to a digital-to-analog conversion circuit and a correction method for a digital-to-analog conversion circuit.

BACKGROUND

In a related art, a current output digital-to-analog (D/A) conversion circuit is known. The D/A conversion circuit includes a plurality of current sources that supply currents weighted depending on binary codes and switch circuits coupled to the current sources. The D/A conversion circuit turns on and off each of the switch circuits according to digital input signals to output a current corresponding to the digital input signals. One example of such a D/A conversion circuit is disclosed in Tao Chen and Georges G. E. Gielen, "A 14-bit 200-MHz Current-Steering DAC With Switching-Sequence Post-Adjustment Calibration", IEEE JOURNAL OF SOLID-STATE CIRCUITS, VOL. 42, NO. 11, NOVEMBER 2007.

SUMMARY

In the D/A conversion circuit, amounts of current of the current sources may be variously deviated from their design values depending on factors such as manufacturing steps and temperatures. The variations cause an error in an output current to influence the characteristics of the D/A conversion circuit.

One aspect of this disclosure is a digital-to-analog conversion circuit. The digital-to-analog conversion circuit includes a plurality of first current sources that are weighted depending on lower-order bits of digital input signals and supplied with a first bias voltage and a plurality of second current sources that are weighted depending on higher-order bits of the digital input signals and supplied with a second bias voltage. A reference current source circuit is configured to generate the first bias voltage and the second bias voltage based on a first reference current. An output circuit is configured to combine currents from the first current sources and currents from the second current sources in accordance with the digital input signals to generate an output current, the currents from the first current sources and the currents from the second current sources being set according to the first reference current. A correction circuit is configured to change the first reference current supplied to the reference current source circuit into a second reference current that is smaller than the first reference current, and adjust the first bias voltage and the second bias voltage based on currents from the first current sources and the second current sources changed according to the second reference current.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory and are not restrictive of the invention, as claimed.

BRIEF DESCRIPTION OF THE DRAWINGS

The embodiment, together with objects and advantages thereof, may best be understood by reference to the following description of the presently preferred embodiments together with the accompanying drawings in which.

DESCRIPTION OF THE EMBODIMENTS

Various embodiments will now be described with reference to the drawings. The embodiments are illustrated by way of example and are not limited by the accompanying figures, in which like references indicate similar elements. Elements in the figures are illustrated for simplicity and clarity and have not necessarily been drawn to scale.

First Embodiment

Figures 1A, 1B:
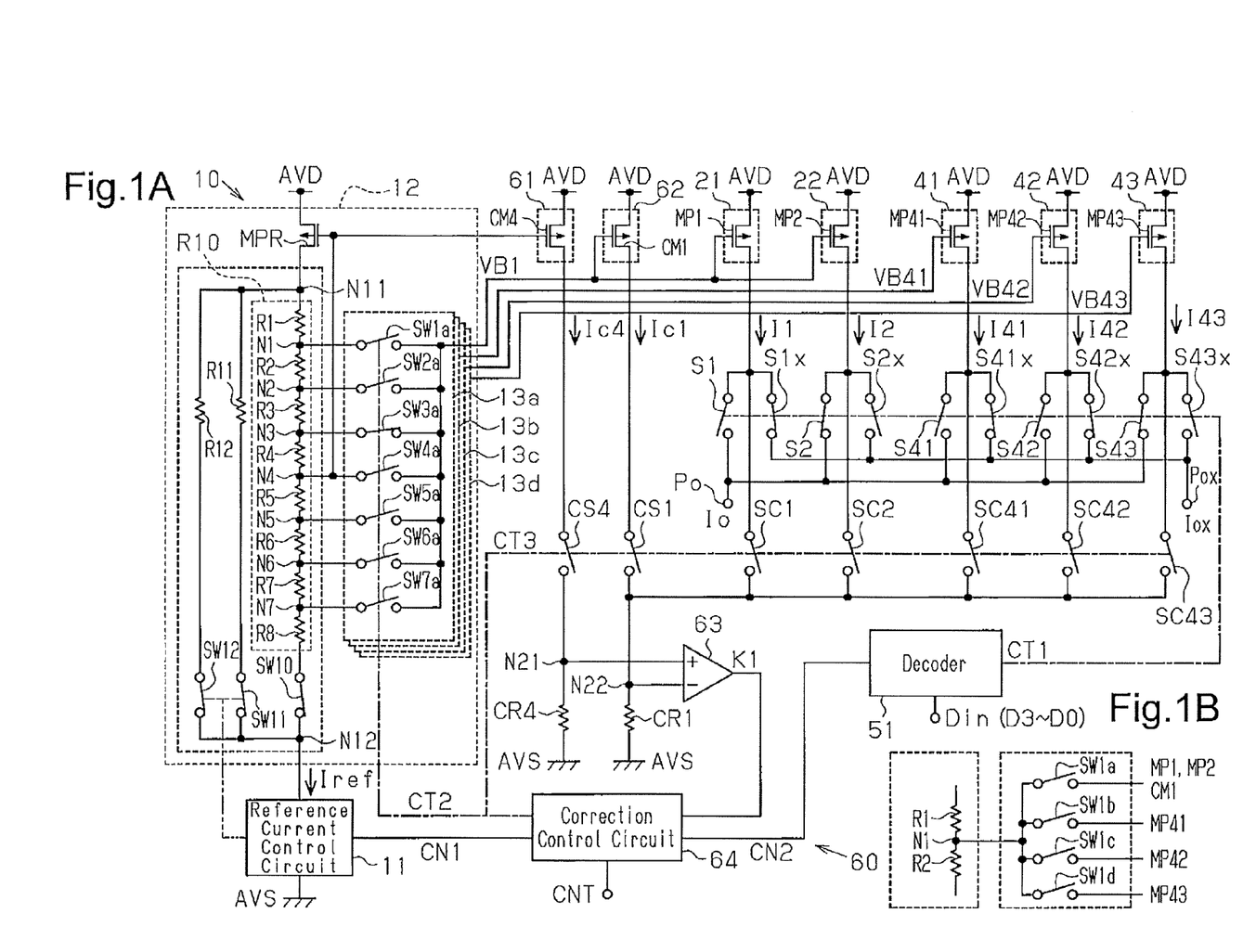
FIG. 1A is a circuit diagram illustrating a digital-to-analog (D/A) conversion circuit according to a first embodiment.
FIG. 1B is a schematic circuit diagram partially illustrating a resistor circuit and a selection circuit.

As illustrated in FIG. 1A, a digital-to-analog (D/A) conversion circuit 10 according to a first embodiment generates output currents Io and Iox according to a digital input signal Din. The output currents Io and Iox change to be complementary to each other. Thus, the output current Iox has a phase opposite to the phase of the output current Io. In the first embodiment, the digital input signal Din is provided as, for example, 4-bit digital input signals D3 to D0. The digital input signal D0 corresponds to a Least Significant Bit (LSB), and the digital input signal D3 corresponds to a Most Significant Bit (MSB).

The D/A conversion circuit 10 includes a reference current control circuit 11 for controlling a reference current Iref. The reference current Iref corresponds to minimum change amounts of the output currents Io and Iox changing depending on the digital input signal Din. The reference current Iref may also be called a unit current hereinafter. The reference current control circuit 11 controls an amount of current of the reference current Iref based on a correction control signal CN1.

A reference current source circuit 12 generates bias voltages VB1, VB41, VB42, and VB43 based on the reference current Iref.

The reference current source circuit 12 includes a reference transistor MPR and resistor circuits R10, R11, and R12. The reference transistor MPR is, for example, a P-channel MOS transistor. A source terminal of the reference transistor MPR is coupled to a wire AVD (i.e., wire supplied with a power supply voltage AVD). A drain terminal of the reference transistor MPR is coupled to each of the resistor circuits R10, R11, and R12.

The resistor circuit R10 is arranged as a resistor ladder circuit including a plurality of (e.g., eight in FIG. 1A) resistors R1 to R8 coupled in series with each other. The resistors R1 to R8 have, for example, equal resistance values, respectively. One end (opposite side of the resistor R2) of the resistor R1 serves as a first terminal of the resistor circuit R10 and is coupled to the drain terminal of the reference transistor MPR. One end (opposite side of the resistor R7) of the resistor R8 serves as a second terminal of the resistor circuit R10 and is coupled to a first terminal of a switch SW10. A second terminal of the switch SW10 is coupled to the reference current control circuit 11. The switch SW10 is kept in an ON state.

The resistor circuit R10 generates, depending on currents flowing through the resistors R1 to R8, divided voltages at nodes N1 to N7 between two adjacent resistors of the resistors R1 to R8, respectively. A gate terminal (control terminal) of the reference transistor MPR is coupled to the node N4 between the resistors R4 and R5 of the resistor circuit R10. The divided voltage at the node N4 is an intermediate voltage of a plurality of divided voltages generated by, for example, the resistor ladder circuit (R10).

A node N11 between the reference transistor MPR and the resistor circuit R10, i.e., the first terminal of the resistor circuit R10 is coupled to a first terminal of each of the resistor circuits R11 and R12. A second terminal of the resistor circuit R11 is coupled to a node N12 between the switch SW10 and the reference current control circuit 11 through a switch SW11. A second terminal of the resistor circuit R12 is coupled to the node N12 through a switch SW12. The reference current control circuit 11 turns on and off the switches SW11 and SW12. When the switch SW11 is turned on, the resistor circuit R11 is coupled in parallel to the resistor circuit R10. Similarly, when the switch SW12 is turned on, the resistor circuit R12 is coupled in parallel to the resistor circuit R10.

Each of the resistor circuits R11 and R12 has a resistance value equal to the resistance value of the resistor circuit R10, i.e., a combined resistance value of the resistors R1 to R8. Although not illustrated in detail, for example, each of the resistor circuits R11 and R12 has the same structure as the resistor circuit R10, and may include a plurality of (i.e., eight in the first embodiment) resistors coupled in series with each other. Thus, when the switches SW11 and SW12 are turned on, a current corresponding to ⅓ of a current flowing through the reference transistor MPR flows through the resistor circuit R10.

The reference current source circuit 12 is further coupled to selection circuits 13a to 13d that are coupled to the nodes N1 to N7 of the resistor circuit R10. The selection circuit 13a includes switches SW1a to SW7a. First terminals of the switches SW1a to SW7a are coupled to the nodes N1 to N7, respectively. Second terminals of the switches SW1a to SW7a are coupled to each other. A coupling node that couples the second terminals of the switches SW1a to SW7a serve as the output terminal of the selection circuit 13a, and is coupled to current sources 21 and 22. The switches SW1a to SW7a are turned on and off such that one of the switches SW1a to SW7a is turned on and the other switches are turned off by a control signal CT2 output from a correction control circuit 64. Thus, the selection circuit 13a selects one of the nodes N1 to N7 to output a bias voltage VB1 corresponding to a divided voltage generated at the selected node.

Although not illustrated in FIG. 1A in detail, in the same manner as the selection circuit 13a, each of the selection circuits 13b to 13d includes seven switches coupled to the nodes N1 to N7. The switches of the selection circuits 13b to 13d are also controlled by the control signal CT2 output from the correction control circuit 64. Thus, in the same manner as the selection circuit 13a, each of the selection circuits 13b to 13d selects one of the nodes N1 to N7 to output a bias voltage corresponding to a divided voltage generated at the selected node. In the first embodiment, the selection circuits 13b to 13d output bias voltages VB41 to VB43, respectively.

FIG. 1B illustrates switches SW1a, SW1b, SW1c, and SW1d of the selection circuits 13a to 13d coupled to the node N1. Each of the selection circuits 13b to 13d has the same structure as the selection circuit 13a. Thus, in the same manner as in FIG. 1B, each of the nodes N2 to N7 is also coupled to the selection circuits 13a to 13d.

As illustrated in FIG. 1A, the second terminal of the switch SW1a, i.e., the output terminal of the selection circuit 13a is coupled to transistors MP1, MP2, and CM1. The second terminal of the switch SW1b, i.e., the output terminal of the selection circuit 13b is coupled to a transistor MP41. The second terminal of the switch SW1c, i.e., the output terminal of the selection circuit 13c is coupled to a transistor MP42. The second terminal of the switch SW1d, i.e., the output terminal of the selection circuit 13d is coupled to a transistor MP43.

Thus, the bias voltage VB1 is applied to the current sources 21 and 22, and the bias voltages VB41 to VB43 are applied to current sources 41 to 43, respectively.

The current source 21 includes the transistor MP1. The reference transistor MP1 is, for example, a P-channel MOS transistor. A source terminal of the reference transistor MP1 is coupled to the wire AVD. The bias voltage VB1 is supplied to the gate terminal of the transistor MP1. The drain terminal of the transistor MP1 is coupled to an output terminal Po through a switch S1 and coupled to an output terminal Pox through a switch S1x.

The current source 22 includes the transistor MP2. The reference transistor MP2 is, for example, a P-channel MOS transistor. The source terminal of the transistor MP2 is coupled to the wire AVD. The bias voltage VB1 is supplied to the gate terminal of the transistor MP2. The drain terminal of the transistor MP2 is coupled to the output terminal Po through a switch S2 and coupled to an output terminal Pox through a switch S2x.

The current sources 21 and 22 generate currents I1 and I2 weighted depending on lower-order bits, i.e., digital input signals D1 and D0 in the first embodiment. The currents I1 and I2 are weighted at a binary (the power of 2) radio. For example, the transistor MP1 of the current source 21 has a size that is adjusted to cause a current equal to a current flowing through the reference transistor MPR to flow. The transistor MP2 of the current source 22 has a size that is adjusted to cause a current the amount of which is twice that of the current flowing through the reference transistor MPR to flow.

A current source 41 includes the transistor MP41. The transistor MP41 is, for example, a P-channel MOS transistor. The source terminal of the transistor MP41 is coupled to the wire AVD. The bias voltage VB41 is supplied to the gate terminal of the transistor MP41. The drain terminal of the transistor MP41 is coupled to the output terminal Po through a switch S41 and coupled to the output terminal Pox through a switch S41x.

A current source 42 includes the transistor MP42. The transistor MP42 is, for example, a P-channel MOS transistor. The source terminal of the transistor MP42 is coupled to the wire AVD. The bias voltage VB42 is supplied to the gate terminal of the transistor MP42. The drain terminal of the transistor MP42 is coupled to the output terminal Po through a switch S42 and coupled to the output terminal Pox through a switch S42x.

A current source 43 includes the transistor MP43. The transistor MP43 is, for example, a P-channel MOS transistor. The source terminal of the transistor MP43 is coupled to the wire AVD. A bias voltage VB43 is supplied to the gate terminal of the transistor MP43. The drain terminal of the transistor MP43 is coupled to the output terminal Po through a switch S43 and coupled to the output terminal Pox through the switch S41x.

The current sources 41, 42, and 43 generate currents I41, I42, and I43 weighted depending on higher-order bits, i.e., the digital input signals D3 and D2 in the first embodiment. For example, the transistors MP41 to MP43 of the current sources 41 to 43 each have a size adjusted to cause a current the amount of which is four times that of the current flowing through the reference transistor MPR to flow. Thus, the amounts of current flowing through the transistors MP41 to MP43 are equal to each other.

A decoder 51 generates a control signal CT1 based on the digital input signals D3 to D0. Although not illustrated in FIG. 1A in detail, the control signal CT1 includes a plurality of switch control signals that independently turn on and off the switches S1, S1x, S2, S2x, S41, S41x, S42, S42x, S43, and S43x.

For example, FIG. 1A illustrates a state in which the output currents Io and Iox are generated in accordance with the digital input signals D3 to D0 expressed as "1001" in the binary numbers. The decoder 51 decodes the digital input signals D3 to D0 to generate the control signal CT1 including a plurality of switch control signals. In FIG. 1A, the switches S1, S2x, S41, S42, and S43x are turned off, and the switches S1x, S2, S41x, S42x, and S43 are turned on. In this case, the output current Io obtained by combining currents I2 and I43 of the current sources 22 and 43 to each other through the switches S2 and S43 is output to the output terminal Po. In addition, the output current Iox obtained by combining currents I1, I41, and I42 of the current sources 21, 41, and 42 through the switches S1x, S41x, and S42x is output to the output terminal Pox. The switches S1, S1x, S2, S2x, S41, S41x, S42, S42x, S43, and S43x and the decoder 51 form an output circuit.

The D/A conversion circuit 10 includes a correction circuit 60 that corrects amounts of current of the current sources 21, 22, and 41 to 43. The correction circuit 60 includes first and second correction current sources 61 and 62, correction switches CS4, CS1, SC1, SC2, and SC41 to SC43, first and second correction resistors CR4 and CR1, a comparator 63, and the correction control circuit 64.

The first correction current source 61 includes a transistor CM4. The transistor CM4 is, for example, a P-channel MOS transistor. The source terminal of the transistor CM4 is coupled to the wire AVD. The gate terminal of the transistor CM4 is coupled to the gate terminal of the reference transistor MPR. The drain terminal of the transistor CM4 is coupled to the first terminal of the correction switch CS4. The second terminal of the correction switch CS4 is coupled to the first terminal of the first correction resistor CR4. The second terminal of the correction resistor CR4 is coupled to the wire AVS.

The second correction current source 62 includes the transistor CM1. The transistor CM1 is, for example, a P-channel MOS transistor. The source terminal of the transistor CM1 is coupled to the wire AVD. A bias voltage VB1 is supplied to the gate terminal of the transistor CM1. The drain terminal of the transistor CM1 is coupled to the first terminal of the correction switch CS1. The second terminal of the correction switch CS1 is coupled to the first terminal of the second correction resistor CR1. The second terminal of the correction resistor CR1 is coupled to the wire AVS. The first and second correction resistors CR1 and CR4 have equal resistance values, respectively.

The first correction current source 61 is weighted to generate a current equal to each of the currents I41 to I43 of the current sources 41 to 43 corresponding to higher-order bits, i.e., the digital input signals D3 and D2. For example, the transistor CM4 of the first correction current source 61 has a size that is adjusted to cause a current the amount of which is four times that of the current flowing through the reference transistor MPR to flow. Thus, an amount of current flowing through the transistor CM4 is equal to an amount of current flowing through each of the transistors MP41 to MP43.

The second correction current source 62 is weighted to generate a current equal to the current I1 of the current source 21 that is weighted depending on the least significant bit, i.e., the digital input signal D0. For example, the transistor CM1 of the second correction current source 62 has a size adjusted to cause a current the amount of which is equal to that of the current flowing through the reference transistor MPR to flow. Thus, an amount of current flowing through the transistor CM1 is equal to the amount of the current I1 flowing through the transistor MP1.

The comparator 63 has a non-inverting input terminal coupled to a node N21 between the correction switch CS4 and the correction resistor CR4 and an inverting input terminal coupled to a node N22 between the correction switch CS1 and the correction resistor CR1. The node N22 is coupled to the drain terminals of the transistors MP1, MP2, and MP41 to MP43 of the current sources 21, 22, and 41 to 43 through the correction switches SC1, SC2, and SC41 to SC43, respectively.

The comparator 63 compares the potential of the node N21 with the potential of the node N22 to output a determination signal K1 having a level depending on the comparison result. The determination signal K1 is supplied to the correction control circuit 64.

The correction control circuit 64 performs a correction process for the D/A conversion circuit 10 based on an external control signal CNT. The external control signal CNT is, for example, a power-on reset signal or an initializing signal. Alternatively, the external control signal CNT may be supplied from a circuit such as a CPU. The external control signal CNT is used as a mode signal for controlling an operation of the D/A conversion circuit 10. For example, the external control signal CNT at an L level sets the D/A conversion circuit 10 to a normal mode, and the external control signal CNT at an H level sets the D/A conversion circuit 10 to a correction mode. In the normal mode, the D/A conversion circuit 10 outputs the output currents Io and Iox depending on the digital input signals D3 to D0. In the correction mode, the D/A conversion circuit 10 corrects amounts of current of the current sources 21, 22, and 41 to 43 used in generation of the output currents Io and Iox.

The current sources 21 and 22 generate the currents I1 and I2 in accordance with the sizes of the transistors MP1 and MP2 and the bias voltage VB1. Thus, the correction control circuit 64 corrects the amounts of the currents I1 and I2 by adjusting the bias voltage VB1. Similarly, the current sources 41 to 43 generate the currents I41 to I43 in accordance with the sizes of the transistors MP41 to MP43 and the bias voltages VB41 to VB43. Thus, the correction control circuit 64 corrects the amounts of the current of the current sources 41 to 43 by adjusting the bias voltages VB41 to VB43.

A method of adjusting the amounts of current of the current sources 21, 22, and 41 to 43 (that is, the bias voltages VB1 and VB41 to VB43) will now be described below.

First, a method of adjusting the bias voltage VB1 supplied to the current sources 21 and 22 will now be described below. The correction control circuit 64 generates the control signal CT2 for controlling the switches of the selection circuits 13a to 13d. The correction control circuit 64 generates a control signal CT3 for controlling the correction switches CS4, CS1, SC1, SC2, and SC41 to SC43. Although not illustrated in detail, each of the control signals CT2 and CT3 includes a plurality of switch control signals. The correction control circuit 64 generates the correction control signal CN1 and a correction control signal CN2. The reference current control circuit 11 controls a correction reference current Irc having an amount of current smaller than that of the reference current Iref based on the correction control signal CN1. In the first embodiment, the amount of current of the correction reference current Irc is ⅓ the amount of current of the reference current Iref. For example, the reference current control circuit 11 includes a current mirror circuit and changes a mirror ratio of the current mirror circuit depending on the correction control signal CN1 to generate the correction reference current Irc. The decoder 51 turns off a switch coupled to a current source to be corrected based on the correction control signal CN2.

Figure 2:
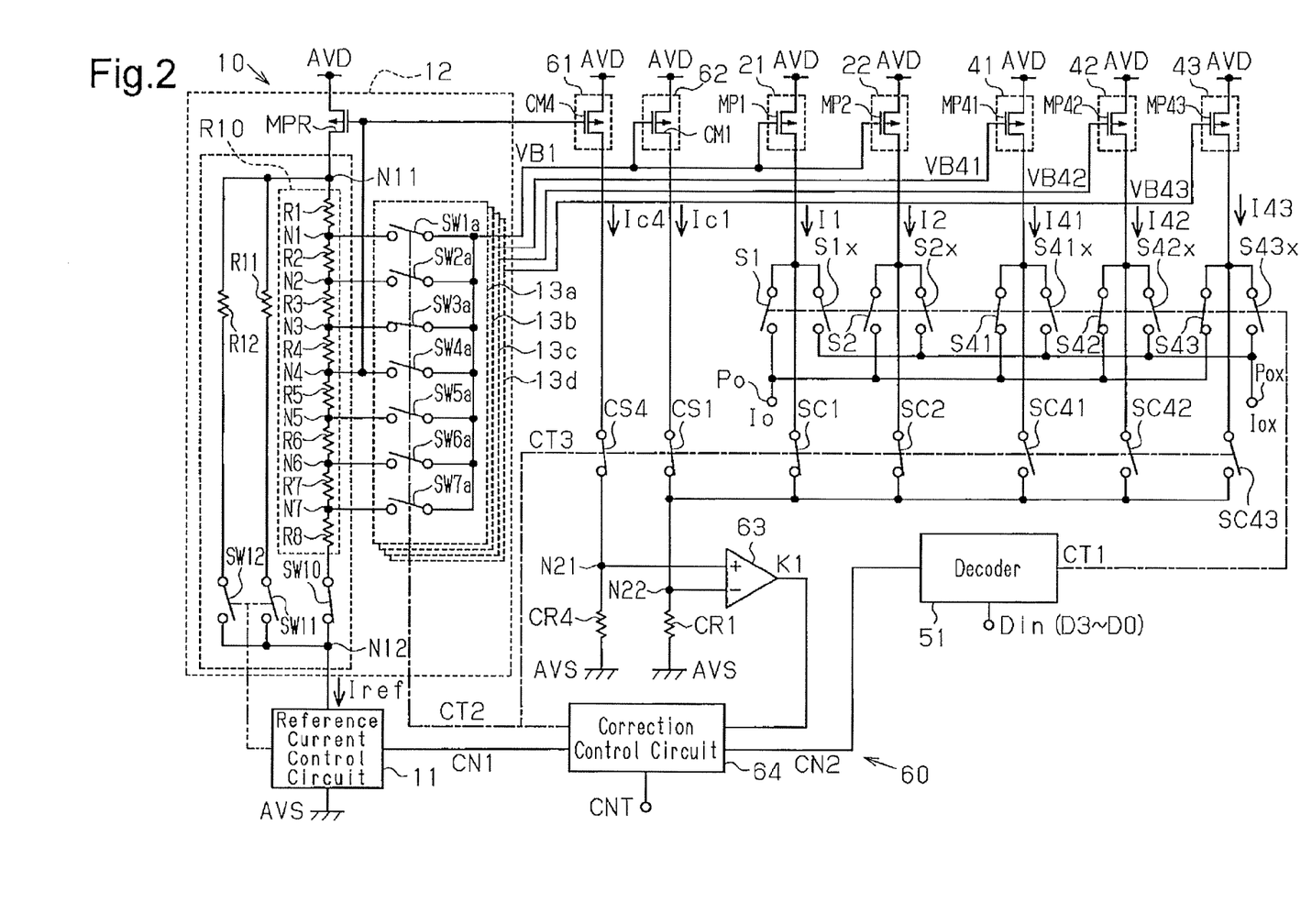
FIG. 2 is a circuit diagram of the D/A conversion circuit of FIG. 1A during a correction process.

FIG. 2 illustrates a state in which the bias voltage VB1 supplied to the current sources 21 and 22 is adjusted. In this case, the switches SW11 and SW12 of the reference current source circuit 12 are turned off. The correction switches CS4 and CS1 coupled to the correction current sources 61 and 62 are turned on. The switches S1, S1x, S2, and S2x coupled to the current sources 21 and 22 are turned off. The correction switches SC1 and SC2 coupled to the correction current sources 21 and 22 are turned on.

The gate terminal of the transistor CM4 of the first correction current source 61 is coupled to the gate terminal of the reference transistor MPR of the reference current source circuit 12. The size of the transistor CM4 is four times the size of the reference transistor MPR. The correction reference current Irc generated by the reference current control circuit 11 flows through the reference transistor MPR. Thus, a current Ic4 that is four times the correction reference current Irc flowing through the reference transistor MPR flows through the transistor CM4. The current Ic4 flows through the correction resistor CR4 through the correction switch CS4. Thus, a voltage depending on the resistance value of the correction resistor CR4 and a current value of the current Ic4 is output to the node N21.

The bias voltage VB1 is supplied to the gate terminal of the transistor CM1 of the second correction current source 62. As described above, the bias voltage VB1 is also supplied to the gate terminals of the transistors MP1 and MP2 of the current sources 21 and 22 weighted depending on lower-order bits, i.e., the digital input signals D1 and D0. The size of the transistor CM1 is equal to the size of the transistor MP1. The size of the transistor MP1 is equal to the size of the reference transistor MPR, and the size of the transistor MP2 is twice the size of the reference transistor MPR. Thus, a sum of amounts of current flowing through the transistors CM1, MP1, and MP2 is four times the amount of current flowing through the reference transistor MPR. The currents Ic1, I1, and I2 flow through the correction resistor CR1 through the correction switches CS1, SC1, and SC2, respectively. Thus, a voltage depending on the resistance value of the correction resistor CR1 and a sum of the amounts of the currents Ic1, I1, and I2 is output to the node N22.

The resistance value of the correction resistor CR1 is equal to the resistance value of the correction resistor CR4. In this case, when the voltage at the node N21 is equal to the voltage at the node N22, the amount of the current Ic4 flowing through the transistor CM4 is equal to a sum of the amounts of the currents Ic1, I1, and I2 flowing through the transistors CM1, MP1, and MP2, respectively. The transistors CM1, MP1, and MP2 generate currents depending on the bias voltage VB1. The correction control circuit 64, based on the determination signal K1 from the comparator 63, adjusts the bias voltage VB1 so that the voltage at the node N21 equals to the voltage at the node N22. In the first embodiment, the correction control circuit 64 adjusts the bias voltage VB1 by selectively turning on one of the switches in the selection circuit 13a.

For example, the correction control circuit 64 uses a search method such as successive searching or binary searching to search a switch position where the voltage at the node N21 becomes equal to the voltage at the node N22. Based on the search result, the correction control circuit 64 turns on any one of the switches SW1a to SW7a of the selection circuit 13a and turns off the others. Thus, the bias voltage VB1 is adjusted to any one of the potentials of the nodes N1 to N7. When the adjusted bias voltage VB1 is supplied to the transistors MP1 and MP2, the transistor MP1 generates the current I1 equal to the correction reference current Irc, and the transistor MP2 generates the current I2 that is twice the correction reference current Irc.

Next, a method of adjusting the bias voltages VB41 to VB43 supplied to the current sources 41 to 43 will now be described below. The correction control circuit 64 adjusts the bias voltage VB41 (i.e., an amount of current of the current source 41) first. The correction control circuit 64 turns off the correction switch CS1 coupled to the second correction current source 62. Further, the correction control circuit 64 turns off the correction switches SC1 and SC2 coupled to the lower-order-bit current sources 21 and 22. The correction control circuit 64 turns on the correction switch SC41 corresponding to the current source 41 and turns off the switches S41 and S41x corresponding to the current sources 42 and 43. The correction control circuit 64, based on the determination signal K1 from the comparator 63, adjusts the bias voltage VB41 so that the voltage at the node N21 becomes equal to the voltage at the node N22. In the first embodiment, the correction control circuit 64 adjusts the bias voltage VB41 by selectively turning on one of the switches in the selection circuit 13b.

Similarly, the correction control circuit 64 adjusts the bias voltage VB42 (amount of current of the current source 42) and the bias voltage VB43 (amount of current of the current source 43). When the adjusted bias voltages VB41 to VB43 are supplied to the transistors MP41 to MP43 of the current sources 41 to 43, the transistors MP41 to MP43 generate the currents I41 to I43 that are four times the correction reference current Irc.

When the correction control circuit 64 completes the adjustment of the bias voltages VB1 and VB41 to VB43, the correction control circuit 64 turns off the correction switches CS4, CS1, SC1, SC2, and SC41 to SC43. The correction control circuit 64 outputs the correction control signals CN1 and CN2 at a second level (for example, an L level). The reference current control circuit 11 turns on the switches SW11 and SW12 of the reference current source circuit 12 in response to the correction control signal CN1 to cause the reference current Iref to flow. The decoder 51, in response to the correction control signal CN2, outputs the control signal CT1 depending on the digital input signals D3 to D0.

Thus, the reference current Iref flows through the reference transistor MPR. The bias voltage VB1 having the potential at any one of the nodes N1 to N7 through the switch turned on in the selection circuit 13a is generated. The current sources 21 and 22 generate the currents I1 and I2 depending on the bias voltage VB1. Similarly, the bias voltage VB41 is generated through the switch turned on in the selection circuit 13b, the bias voltage VB42 is generated through the switch turned on in the selection circuit 13c, and the bias voltage VB43 is generated through the switch turned on in the selection circuit 13d. The current sources 41 to 43 generate the currents I41 and I43 depending on the bias voltages VB41 to VB43, respectively.

The operation of the D/A conversion circuit 10 will now be described below. An amount of current of a current source will now be described first. A difference between an amount of current of a current source in design and an amount of current of the current source in use, that is, a fluctuation in amount of current is called a current mismatch. When a design value of an amount of current of the current source is given by Ids and a difference between amounts of current is given by ΔIds, the current mismatch is expressed by the following equation.

$$\frac{\Delta Ids}{Ids} = \frac{\frac{1}{2}\mu \cdot Cox\frac{W}{L}(Veff+\Delta Vth)^2 - \frac{1}{2}\mu \cdot Cox\frac{W}{L}(Veff)^2}{\frac{1}{2}\mu \cdot Cox\frac{W}{L}(Veff)^2} = \quad (1)$$

$$\frac{2 \cdot Veff \cdot \Delta Vth + \Delta Vth^2}{Veff^2} \approx \frac{2\Delta Vth}{Veff} = \frac{2A}{Veff\sqrt{LW}} = \frac{A}{L}\sqrt{\frac{2 \cdot \mu \cdot Cox}{Ids}}$$

$$\because Veff = Vgs - Vth = \sqrt{\frac{2Ids}{\mu \cdot Cox \cdot \frac{W}{L}}} \quad (2)$$

$$\because \mu \propto T^{3/2}$$

The above equation is an approximate equation. In the above equation, Veff denotes an active gate voltage, p denotes a mobility (carrier mobility), Cox denotes a gate capacitance, W denotes a gate width, L denotes a gate length, Vth denotes a threshold voltage, Ids denotes a drain-source current, and A denotes a parameter depending on a process.

As illustrated in the equation (2), the mobility p that influences the current mismatch changes with respect to a temperature T and increases greatly at a high temperature more than at a low temperature. The temperature T is a temperature around a current source formed in, for example, a semiconductor device (semiconductor chip).

Thus, in foreground correction that performs correction in the correction mode being independent of the normal mode, when a temperature in a D/A converting operation (after correction) is lower than a temperature during correction, the current mismatch increases. When the current mismatch in the converting operation increases depending on a temperature during correction and a correction value, output characteristics are deteriorated. For example, a characteristic value, such as differential nonlinearity (DNL), increases over an operation guarantee range (specification).

The temperature T is a parameter that is not changed by a circuit configuration. On the other hand, the current Ids is a parameter that may be changed by the circuit configuration. An operation state of a circuit when the current Ids is small is equivalent to a worst state of the circuit. In the D/A conversion circuit 10 illustrated in FIG. 1A, the reference current Iref is controlled such that the D/A conversion circuit 10 is set to the worst state. Thus, the reference current control circuit 11 generates the correction reference current Irc to set the D/A conversion circuit 10 to the worst state.

An amount of current of the correction reference current Irc is set depending on a guaranteed temperature range that guarantees the normal operation of the D/A conversion circuit 10. In this case, for example, when correction is performed under a condition of a highest temperature TH in the guaranteed temperature range, a current error in the D/A conversion circuit 10 is maximum when the D/A conversion circuit 10 operates at a lowest temperature TL in the guaranteed temperature range.

When only the temperature is changed based on the relationship between the equation (1) and the equation (2), if the current error at the highest temperature TH is set to "1", the current error at the lowest temperature TL is expressed by the following equation.

$$\sqrt{V((TL/TH)^{(-3/2)})}$$

When the current error is adjusted by the current Ids, the current Ids is set such that a current error ΔIH at the highest temperature TH is equal to or larger than a current error ΔIL at the lowest temperature TL, that is, to satisfy the following equation.

$$\Delta IH/\Delta IL \geq 1 \quad (3)$$

The current Ids at the highest temperature TH is given by IdsH, and the current Ids at the lowest temperature TL is given by IdsL. In this case, based on the equation (1) and the equation (3), a ratio of the current IdsH to the current IdsL is expressed by the following equation.

$$IdsH/IdsL \leq (1/\sqrt{((TL/TH)^{(-3/2)})})^2$$

Thus, the correction reference current Irc is preferably set to be "(TL/TH)^(3/2)" times or less the reference current Iref in D/A conversion.

For example, when the highest temperature TH is given by 125° C. and the lowest temperature TL is given by −40° C., the following equation is derived.

$$(TL/TH)^{(3/2)}=((273-40)/(273+125))^{(3/2)}=0.448$$

Thus, the correction reference current Irc is preferably set to be "0.448" times or less the reference current Iref. Accordingly, in the first embodiment, the correction reference current Irc is set to be ⅓ the reference current Iref.

In the first embodiment, the current that is ⅓ the reference current Iref flows through each of the resistors R1 to R8 of the resistor circuit R10. This current is equal to the correction reference current Irc. A potential difference between both the terminals of each of the resistors R1 to R8 is equal to a potential difference between both the ends of each of the resistors R1 to R8 generated by the correction reference current Irc. Thus, a voltage difference between a gate voltage of the reference transistor MPR and a potential at the node N4 coupled to the gate terminal of the reference transistor MPR is equal to a voltage difference in a correction process. Further, a potential difference between the voltage at the node N4 and the voltage at any one of the nodes N1 to N7 coupled to the switch (ON switch) selected by each of the selection circuits 13a to 13d is equal to a potential difference in the correction process.

After the correction, the voltage at the node (any one of the nodes N1 to N7) selected by the selection circuit 13a corresponds to the bias voltage VB1. Similarly, voltages at nodes selected by the selection circuits 13b to 13d correspond to the bias voltages VB41 to VB43, respectively. The bias voltages VB1 and VB41 to VB43 are supplied to the transistors MP1, MP2, and MP41 to MP43 of the current sources 21, 22, and 41 to 43. In this manner, voltage differences between the gate voltage of the reference transistor MPR and the gate voltages of the transistors MP1, MP2, and MP41 to MP43 of the current sources 21, 22, and 41 to 43 are adjusted by the correction process, and the adjusted difference voltage is kept even after the correction.

Each of the bias voltages VB1 and VB41 to VB43 is equal to one of divided voltages generated at the nodes N1 to N7 by the resistors R1 to R8 of the resistor circuit R10. In this case, amounts of current flowing through the transistors MP1, MP2, and MP41 to MP43 may not be exactly equal to an amount of current weighted by the correction reference current Irc flowing through the reference transistor MPR during the correction. In other words, a small current error that does not influence the characteristics of the D/A conversion circuit 10 may be left after the correction. However, an amount of current of each of the transistors MP1, MP2, and MP41 to MP43 in digital-to-analog conversion (after correction) is three times that during the correction. Thus, the small current error left in the digital-to-analog conversion is $1/\sqrt{3}$ times that during the correction as a whole. In this manner, when the reference current Iref is larger than the correction reference current Irc, the small current error left in the digital-to-analog conversion decreases depending on an amount of current of the reference current Iref.

This is also applied to a change in current error caused by the temperature of the D/A conversion circuit 10. As described above, when the temperature decreases, the current error of the current source increases. For example, correction is performed at the highest temperature TH (125° C.). Thereafter, even though a peripheral temperature of the D/A conversion circuit 10 becomes the lowest temperature TL (−40° C.) during the digital-to-analog conversion, the reference current Iref is three times the correction reference current Irc. Consequently, the current error left in the digital-to-analog conversion is $(1/\sqrt{3})$ times that in correction as a whole. Namely, in this case, a current error caused by a change in temperature becomes $1.5*(1/\sqrt{3}) \approx 0.87$ times.

In this manner, the correction reference current Irc is smaller than the reference current Iref in digital-to-analog conversion, and set to be ⅓ the reference current Iref in the first embodiment. Thus, a current error in digital-to-analog conversion is smaller than the current error in correction. Further, a current error caused by a temperature is also reduced. Thus, the D/A conversion circuit 10 may maintain the current error within the operation guarantee range by performing foreground correction once.

In the D/A conversion circuit 10 according to the first embodiment, when a high-potential voltage AVD changes, the gate voltage of the reference transistor MPR and the gate voltages of the transistors MP1, MP2, and MP41 to MP43 change. Thus, even though the high-potential voltage AVD changes, voltage differences between the gate voltage of the reference transistor MPR and the gate voltages of the transistors MP1, MP2, and MP41 to MP43 are maintained in the correction state. That is, current ratios of the currents I1, I2, and I41 to I43 in the current sources 21, 22, and 41 to 43 do not change. Thus, the characteristics to the change in high-potential voltage AVD are suppressed from being deteriorated without performing a correction process again.

An offset of the comparator 63 and fluctuations in resistance values of the correction resistors CR4 and CR1 do not influence the characteristics (e.g., DNL) of the D/A conversion circuit 10. For example, the resistance values of the correction resistors CR4 and CR1 may be different from each other. The bias voltage VB1 is adjusted based on currents of the current sources 62, 21, and 22 (transistors CM1, MP1, and MP2) coupled to the correction resistor CR1. Similarly, the bias voltages VB41 to VB43 are adjusted by sequentially coupling the current sources 41 to 43 (transistors MP41 to MP43) to the correction resistor CR1. Thus, radios of the bias voltages VB1 of the current sources 21 and 22 (transistors MP1 and MP2) and the bias voltages VB41 to VB43 of the current sources 41 to 43 (transistors MP41 to MP43) are not influenced by the resistance value of the correction resistor CR1.

Figure 3:
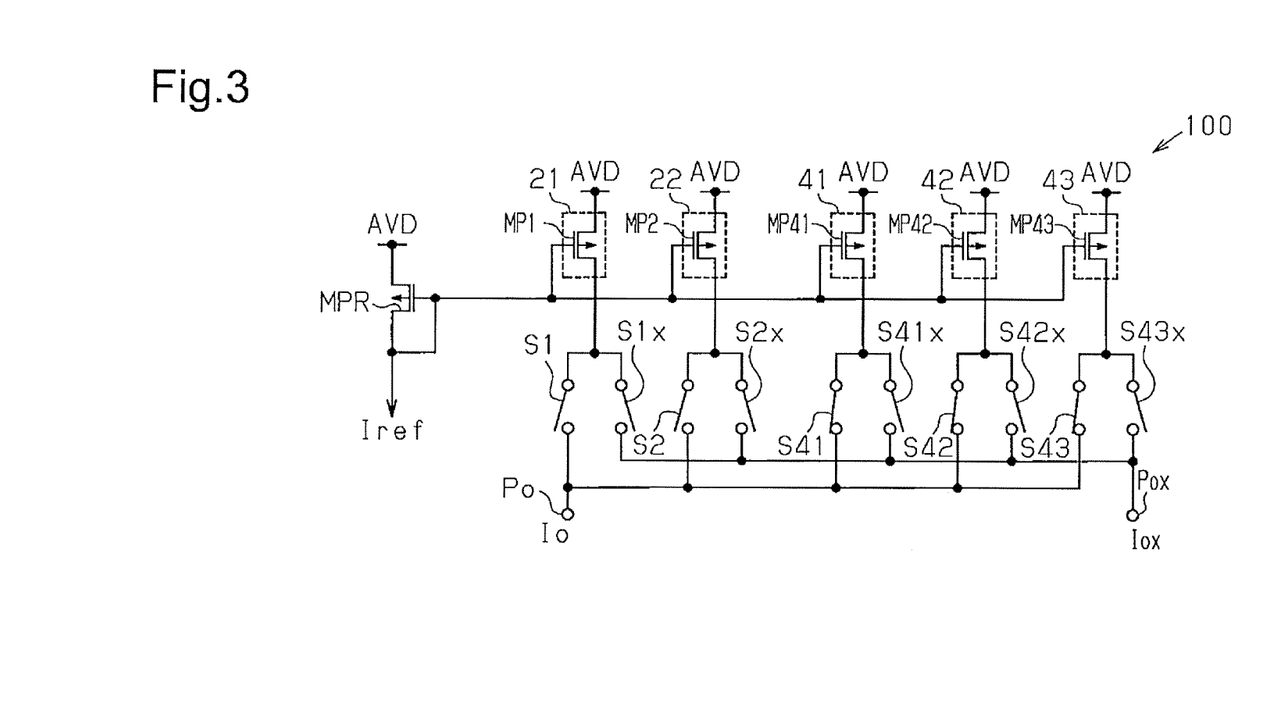
FIG. 3 is a circuit diagram illustrating a D/A conversion circuit according to a comparative example.

FIG. 3 illustrates a D/A conversion circuit 100 according to a comparative example. The same reference numerals as in the above embodiment denote the same members in the D/A conversion circuit 100.

In the D/A conversion circuit 100, the gate terminals of the transistors MP1, MP2, and MP41 to MP43 of the current sources 21, 22, and 41 to 43 are coupled to the gate terminal and the drain terminal of the reference transistor MPR that generates the reference current Iref. Correlative ratios of the currents flowing through the transistors MP1, MP2, MP41, MP42, and MP43 are given by 1:2:4:4:4. The correlative ratios are deviated from design values due to variations of element positions in, for example, manufacturing. The deviation of current is larger in a current source that flows a large amount of current.

For example, when an amount of current of the current source 41 is smaller than a sum (3I) of amounts of current of the current sources 21 and 22 corresponding to lower-order bits, in use of the current source 41, the output current Io decreases with respect to an increase in number of digital input signals. As a result, so-called non-monotone occurs. On the other hand, when the amount of current of the current source 41 is larger than five times (5I) a unit current, a value of the differential nonlinearity (DNL) that is one of characteristics of the D/A conversion circuit 10 exceeds ±1LSB.

Further, the amounts of current of the current sources 21, 22, and 41 to 43 change depending on temperatures and power supply voltages. One method of correcting the change in amount of current is background correction. A semiconductor device that performs background correction includes two conversion circuits, performs a conversion process in one conversion circuit, and performs a correction process in the other conversion circuit. In the two conversion circuits, the conversion process and the correction process are alternately performed to make it possible to correct the amounts of current of the current sources 21, 22, and 41 to 43 with respect to variable factors such as temperatures and voltages. However, in the background correction, since the two conversion circuits are alternately switched, noise in a frequency band depending on a switching cycle may be superposed on an output current. This influences digital-to-analog conversion accuracy.

The first embodiment has the advantages described below.

(1-1) The D/A conversion circuit 10 includes the current sources 21, 22, and 41 to 43 weighted depending on the digital input signal Din. The current sources 21 and 22 generate currents I1 and I2 weighted by a binary (the power of 2) radio (1:2) depending on lower-order bits, i.e., the digital input signals D1 and D0. The current sources 41, 42, and 43 generate currents I41, I42, and I43 weighted depending on higher-order bits, i.e., the digital input signals D3 and D2.

The reference current source circuit 12 generates the bias voltage VB1 for the current sources 21 and 22 and bias voltages VB41 to VB43 for the current sources 41 to 43 based on the reference current Iref. A decoder 51 generates the control signal CT1 based on the digital input signals D3 to D0. The switches S1, S1x to S43, and S43x are turned on and off in response to the control signal CT1. Depending on the states of the switches S1, S1x to S43, and S43x, the currents I1, I2, and I41 to I43 of the current sources 21, 22, and 41 to 43 are combined to each other. As a result, the output currents Io and Iox are generated.

The reference current control circuit 11 supplies the correction reference current Irc smaller than the reference current Iref to the reference current source circuit 12 based on the correction control signal CN1 from the correction control circuit 64. The correction control circuit 64 adjusts the bias voltages VB1 and VB41 to VB43 based on currents flowing through current sources 21, 22, and 41 to 43 depending on the correction reference current Irc.

In each of the current sources 21, 22, and 41 to 43, a current error generated by manufacturing depends on a change in temperature, and the current error increases at a low temperature. The correction reference current Irc is set based on the worst condition such that the correction reference current Irc is corrected at the highest temperature TH (for example, 125° C.) within the guaranteed temperature range and is subjected to a D/A conversion process at the lowest temperature TL (−40° C.). Thus, amounts of current of the current sources 21, 22, and 41 to 43 (bias voltages VB1 and VB41 to VB43) are adjusted by the correction reference current Irc corresponding to the worst condition. Thus, even though the temperature changes within the guaranteed temperature range, the current error of each of the current sources 21, 22, and 41 to 43 is maintained within the operation guarantee range. In this manner, since the current error is suppressed within the operation guarantee range by performing a correction process once, the correction process need not be performed again depending on a factor such as a change in temperature. As a result, the D/A conversion circuit 10 may be continuously used. Since there is no noise generated in background correction in which the correction process is repeatedly executed, the stable output currents Io and Iox may be generated.

(1-2) Amounts of current of the current sources 41 to 43 (bias voltages VB41 to VB43) corresponding to the digital input signals D3 and D2 serving as higher-order bits are corrected. This reduces mutual current errors caused by positions where the current sources 41 to 43 are formed. Thus, differential nonlinearity (DNL) caused by a variation in process or a change in temperature may be suppressed from being deteriorated.

(1-3) The correction circuit 60 includes the first correction current source 61 that generates a current equal to that of each of the current sources 41 to 43 corresponding to higher-order bits and the second correction current source 62 that generates a current equal to that of the current source 21 corresponding to lower-order bits, i.e., a minimum current. During the correction, the correction control circuit 64 combines the current Ic1 of the second correction current source 62 and the currents I1 and I2 of the current sources 21 and 22 corresponding to lower-order bits to cause the combined current to flow through the correction resistor CR1. Under the control by the correction control circuit 64, the current Ic4 of the first correction current source 61 flows through the correction resistor CR4. The comparator 63 compares the voltage at the node N21 coupled to the correction resistor CR4 with the voltage at the node N22 coupled to the correction resistor CR1 to output the determination signal K1 depending on the comparison result. Based on the determination signal K1, the correction control circuit 64 adjusts the bias voltage VB1 supplied to the current sources 62, 21, and 22. The correction control circuit 64 adjusts the bias voltages VB41 to VB43 supplied to the current sources 41 to 43 such that the current Ic4 of the first correction current source 61 is equal to each of the currents of the current sources 41 to 43 corresponding to higher-order bits.

A sum of amounts of the currents I1 and I2 of the current sources 21 and 22 corresponding to the lower-order bits is smaller than each of the amounts of currents I41 to I43 of the current sources 41 to 43 corresponding to the higher-order bits. A ratio of currents flowing through the current sources 21, 22, and 41 to 43 depending on the reference current Iref in D/A conversion is equal to a current ratio adjusted by the correction reference current Irc during the correction. For example, when the current sources 21 and 22 are switched to the current source 41 by the digital input signal Din, the output current Io increases (thus, output current Iox decreases). Accordingly, the differential nonlinearity (DNL) caused by a variation in process may be suppressed from being deteriorated.

(1-4) An amount of the correction reference current Irc flowing through the resistor circuit R10 during the correction is set to be ⅓ the reference current Iref. The resistor circuits R11 and R12 having resistance values equal to that of the resistor circuit R10 after the correction are coupled in parallel to the resistor circuit R10 to supply a current equal to that during the correction to the resistor circuit R10. Thus, the difference between the bias voltage VB1, VB41, VB42, VB43 set during the correction and the gate voltage of the reference transistor MPR is maintained even after the correction. Therefore, an offset voltage of the comparator 63 and fluctuations in resistance values of the correction resistors CR4 and CR1 do not influence of the current ratios of the current sources 21, 22, and 41 to 43 obtained after the correction. In this manner, correction may be performed at high accuracy without being influenced by the variations in the offset voltage of the comparator 63 and the resistance values of the correction resistors CR4 and CR1 in the correction circuit 60.

Second Embodiment

A second embodiment will now be described below. The same reference numerals as in the first embodiment denote the same elements in the second embodiment, and all or some of the descriptions thereof will be omitted.

Figure 4:
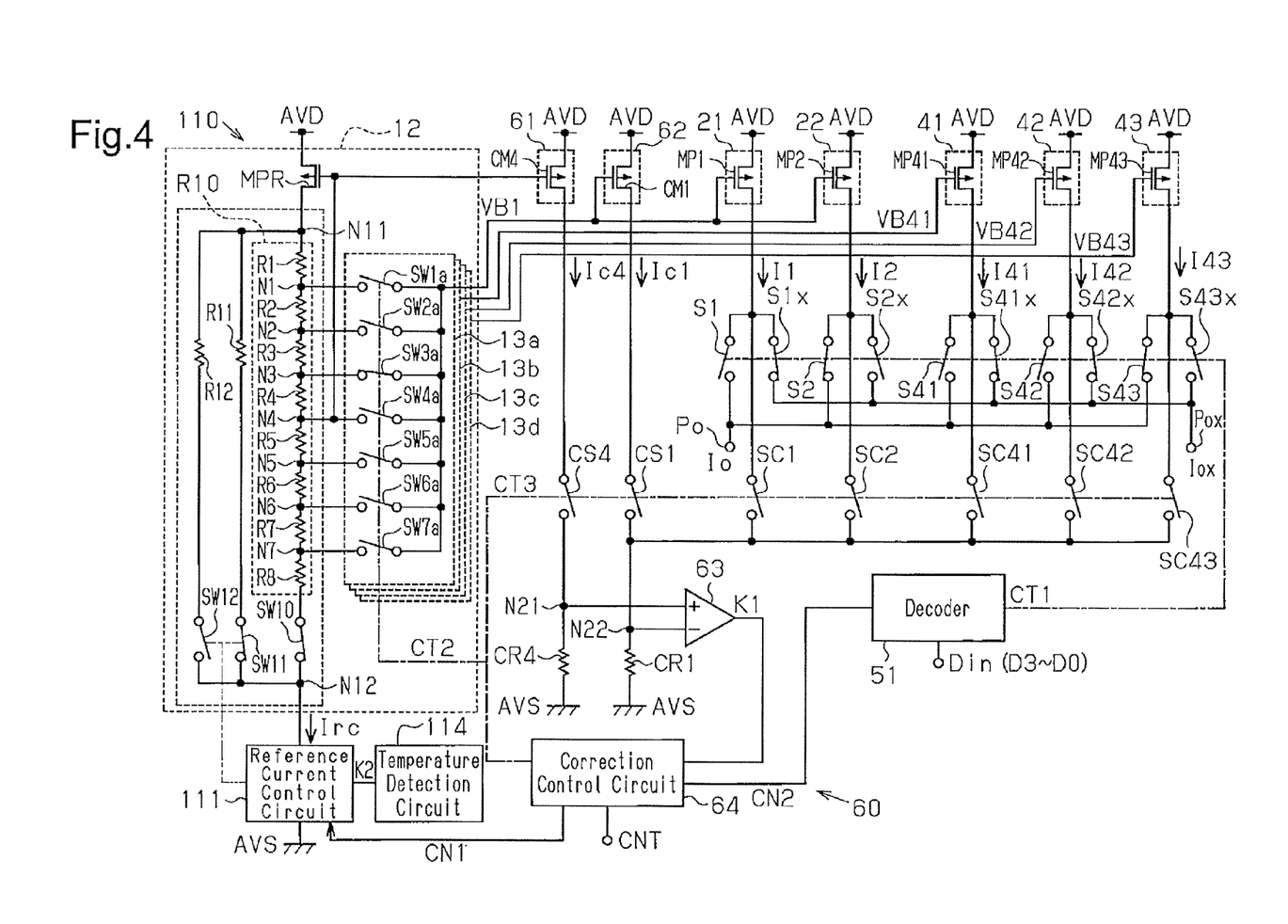
FIG. 4 is a circuit diagram illustrating a D/A conversion circuit according to a second embodiment.

As illustrated in FIG. 4, a D/A conversion circuit 110 includes a temperature detection circuit 114. The temperature detection circuit 114 detects a temperature of the D/A conversion circuit 110 to output a detection signal K2 depending on the detected temperature. A reference current control circuit 111, based on the detection signal K2 of the temperature detection circuit 114, adjusts the correction reference current Irc to a current that is 1/x (x=1, 2, 3) the reference current Iref.

The reference current control circuit 111 controls the switches SW11 and SW12 depending on the adjusted correction reference current Irc. The reference current control circuit 111 controls the switches SW11 and SW12 such that a current flowing through the resistor circuit R10 is equal to the correction reference current Irc when the reference current Iref is output.

For example, when X=1 is set, the reference current control circuit 111 turns off the switches SW11 and SW12. Thus, an amount of current flowing through the resistor circuit R10 becomes equal to the reference current Iref. For example, when X=2 is set, the reference current control circuit 111 turns on the switch SW11 and turns off the switch SW12. Thus, an amount of current flowing through the resistor circuit R10 is set to be ½ the reference current Iref. When X=3 is set, the reference current control circuit ill turns on the switches SW11 and SW12. Thus, an amount of current flowing through the resistor circuit R10 is set to be ⅓ the reference current Iref.

For example, the guaranteed temperature range of the D/A conversion circuit 110 is set to 125° C. (TH) to −40° C. (TL), and a temperature in correction is set to TC. A current error in a current source increases with a decrease in temperature. In this case, in consideration of D/A conversion performed at the lowest temperature TL in the guaranteed temperature range, it is preferable that an amount of current of the correction reference current Irc be set based on a temperature TC in correction and the lowest temperature TL of the guaranteed temperature range. Thus, based on the concept of the first embodiment, the correction reference current Irc is preferably set to be "(TL/TC)^(3/2)" times or less the reference current Iref in conversion.

For example, when the temperature TC in correction is 25° C., $(TL/TC)^{(3/2)}$ is given by $((273-40)/(273+25))^{(3/2)}=0.691$. In this case, the correction reference current Irc is set to be ½ (=0.5) the reference current Iref. That is, after the correction, the switch SW11 is turned on, and the switch SW12 is turned off. As a result, a current ratio of the current sources 21, 22, and 41 to 43 in correction are maintained.

When the temperature TC in correction is −40° C., $(TL/TC)^{(3/2)}$ is given by $((273-40)/(273-40))^{(3/2)}=1$. In this case, the correction reference current Irc has an amount set to be equal to the amount of the reference current Iref. That is, after the correction, the switches SW11 and SW12 are turned off. As a result, the current ratio of the current sources 21, 22, and 41 to 43 in correction are maintained. Decrease in amount of current flowing through the transistors MP1, MP2, and MP41 to MP43 of the current sources 21, 22, and 41 to 43 causes an increase in noise. Thus, the correction reference current Irc is preferably set depending on the temperature of the D/A conversion circuit 110. This suppresses the increase in nose and obtains a stable correction result.

Figure 5:
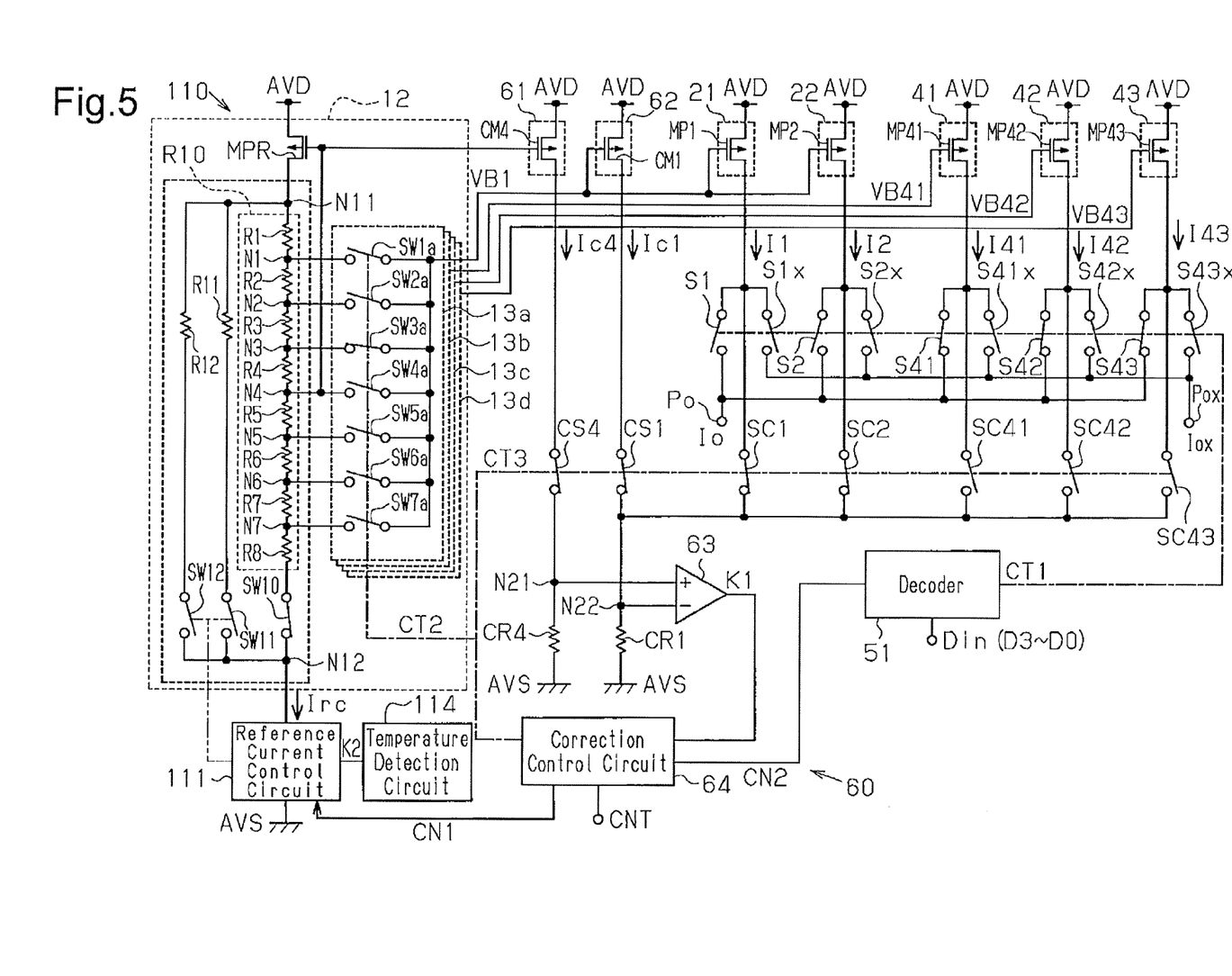
FIG. 5 is a circuit diagram of the D/A conversion circuit of FIG. 4 during a correction process.

FIG. 5 illustrates a state in which the bias voltage VB1 supplied to the current sources 21 and 22 is adjusted as in FIG. 2 of the first embodiment. In this case, FIG. 4 illustrates a state after a correction process for setting the correction reference current Irc to be ½ the reference current Iref. That is, in FIG. 4, based on the correction reference current Irc (Iref/2), the switch SW11 is turned on, and the switch SW12 is turned off.

The second embodiment has the following advantages in addition to the advantages of the first embodiment.

(2-1) The temperature detection circuit 114 outputs the detection signal K2 depending on the temperature of the D/A conversion circuit 110. The reference current control circuit 111 controls an amount of current of the correction reference current Irc depending on the detection signal K2. When amounts of current flowing through the reference transistor MPR and the current sources 21, 22, 41 to 44, 61, and 62 are small, an amount of noise is larger than that generated when the amounts of current are large. Thus, an amount of current of the correction reference current Irc is increased depending on a temperature at which the correction process is performed to make it possible to reduce an amount of noise in correction and to perform a stable correction process. This stably adjusts the bias voltages VB1 and VB41 to VB43 and improves characteristics (e.g., DNL) in the D/A conversion circuit 110.

It should be apparent to those skilled in the art that the above embodiment may be embodied in many other specific forms without departing from the scope of the invention. Particularly, it should be understood that the above embodiment may be embodied in the following forms.

In each of the embodiments, an amount of current of the correction reference current Irc may be arbitrarily changed. For example, as described in the first embodiment, when the highest temperature TH is set to 125° C. and the lowest temperature TL is set to −40° C., $(TL/TH)^{(3/2)}$ is given by $((273-40)/(273+125))^{(3/2)}=0.448$. Thus, for example, the correction reference current Irc may be set to be ½.5 (=0.4) the reference current Iref.

In the second embodiment, the correction reference current Irc may be set to be ½ or ⅓ the reference current Iref.

In each of the embodiments, the D/A conversion circuit may generate any one of the output current Io and the output current Iox.

In each of the embodiments, an order of adjusting the bias voltages VB1 and VB41 to VB43 may be arbitrarily changed. An order of adjusting the bias voltages VB41 to VB43 may be arbitrarily changed. For example, the bias voltages VB43, VB42, and VB41 are adjusted in this order, and, thereafter, the bias voltage VB1 may be adjusted.

In each of the embodiments, amounts of current of the current sources 41 to 43 corresponding to higher-order bits, i.e., the digital input signals D3 and D2 are adjusted by the bias voltages VB41 to VB43. The current sources 41 to 43 are formed to have sizes equal to each other. Thus, differences (fluctuations) of amounts of current in the current sources 41 to 43 are small. From this viewpoint, any one of the bias voltages VB41 to VB43 (for example, the bias voltage VB41) may be adjusted by the above method to turn on a switch coupled to the same node as the node (any one of the nodes N1 to N7) that outputs the bias voltage VB41 so as to generate the bias voltages VB42 and VB43. In other words, the bias voltages VB41, VB42, and VB43 may be equal to each other.

The gate terminals of the transistors MP41 to MP43 of the current sources 41 to 43 may be coupled to each other, and the gate terminals may be coupled to the nodes N1 to N7 of the reference current source circuit 12 through one selection circuit. In other words, a bias voltage depending on a voltage at a node (any one of the nodes N1 to N7) selected by one selection circuit may be supplied to each of the current sources 41 to 43. In this case, the bias voltage is adjusted such that one current from the current sources 41 to 43 is equal to the current Ic4 of the first correction current source 61.

In each of the embodiments, adjustment information of the bias voltages VB1 and VB41 to VB43 (for example, switch control information for controlling the selection circuits 13a to 13d) are stored in a storage circuit. As the storage circuit, for example, an electrically programmable nonvolatile memory may be used. According to this structure, the adjustment information is read from the storage circuit when the power is turned on, for example, and the switches of the selection circuits 13a to 13d are controlled depending on the adjustment information.

In each of the embodiments, reference current control circuits 11 or 111 may control the reference current Iref depending on the external control signal CNT.

In each of the embodiments, the correction control circuit 64 controls the switches S1, S1x to S43, and S43x through the decoder 51. Instead, in the correction process, the correction control circuit 64 may directly control the switches S1, S1x to S43, and S43x.

In the first embodiment, the correction reference current Irc is set to be ⅓ the reference current Iref. The resistor circuits R11 and R12 are coupled in parallel to the resistor circuit R10 so as to cause a current equal to the correction reference current Irc (⅓ the reference current Iref) to flow through the resistor circuit R10 in D/A conversion. Instead, for example, a resistor circuit having a resistance value that is ½ a combined resistance value of the resistor circuit R10 may be coupled in parallel to the resistor circuit R10.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to an illustration of the superiority and inferiority of the invention. Although embodiments of the present invention have been described in detail, it should be understood that various changes, substitutions, and alterations could be made hereto without departing from the spirit and scope of the invention.

The invention claimed is:

1. A digital-to-analog conversion circuit comprising:
   a plurality of first current sources that are weighted depending on lower-order bits of digital input signals and supplied with a first bias voltage;
   a plurality of second current sources that are weighted depending on higher-order bits of the digital input signals and supplied with a second bias voltage;
   a reference current source circuit configured to generate the first bias voltage and the second bias voltage based on a first reference current;
   an output circuit configured to combine currents from the first current sources and currents from the second current sources in accordance with the digital input signals to generate an output current, the currents from the first current sources and the currents from the second current sources being set according to the first reference current; and
   a correction circuit configured to change the first reference current supplied to the reference current source circuit into a second reference current that is smaller than the first reference current, and adjust the first bias voltage and the second bias voltage based on currents from the first current sources and the second current sources changed according to the second reference current.

2. The digital-to-analog conversion circuit according to claim 1, wherein the reference current source circuit includes:
   a reference transistor including a first current terminal, a second current terminal, and a control terminal, wherein the first current terminal is supplied with a power supply voltage;
   a first resistor circuit coupled to the second current terminal of the reference transistor, wherein the first resistor circuit includes a plurality of resistors that are coupled in series to each other and is configured to generate a plurality of divided voltages at a plurality of nodes between the resistors, and the control terminal of the reference transistor is coupled to one of the plurality of nodes;
   a first selection circuit including a plurality of switches, each of the switches including a first terminal coupled to the plurality of nodes and a second terminal coupled to the plurality of first current sources;
   a second selection circuit including a plurality of switches, each of the switches including a first terminal coupled to the plurality of nodes and a second terminal coupled to the plurality of second current sources;
   a second resistor circuit coupled to the second current terminal of the reference transistor; and
   a switch circuit configured to couple the second resistor circuit in parallel to the first resistor circuit to divide the first reference current flowing through the reference transistor into the first resistor circuit and the second resistor circuit, and
   wherein the second resistor circuit has a resistance value that causes a current equal to the second reference current to flow through the first resistor circuit.

3. The digital-to-analog conversion circuit according to claim 2, wherein the control terminal of the reference transistor is coupled to an intermediate node of the plurality of nodes in the first resistor circuit.

4. The digital-to-analog conversion circuit according to claim 2, wherein the correction circuit includes:
   a first correction current source configured to generate a current that is equal to a current generated by each of the second current sources;
   a second correction current source configured to generate a current that is equal to a minimum current generated by one of the first current sources;
   a first correction resistor coupled to the first correction current source;
   a second correction resistor having a resistance value equal to that of the first correction resistor;
   a comparator coupled to the first and second correction resistors; and
   a correction control circuit configured to control the switches of the first selection circuit and the switches of the second selection circuit in accordance with an output signal from the comparator, and
   wherein the correction control circuit is configured to
      adjust the first bias voltage by coupling the second correction current source and the first current sources to the second correction resistor and selectively turning on one of the switches of the first selection circuit in accordance with the output signal from the comparator, and
      adjust the second bias voltage by selectively coupling one of the second current sources to the second correction resistor and selectively turning on one of the switches of the second selection circuit in accordance with the output signal from the comparator.

5. The digital-to-analog conversion circuit according to claim 2, wherein the second selection circuit is one of a plurality of second selection circuits, each of the second selection circuits being coupled to one of the second current sources to output the second bias voltage supplied to the corresponding second current source, and
   the correction control circuit is configured to sequentially couple one of the second current sources to the second correction resistor and selectively turn on one of the switches of the second selection circuit corresponding to the second current source coupled to the second correction resistor so as to adjust the second bias voltage supplied to the second current source coupled to the second correction resistor.

6. A digital-to-analog conversion circuit comprising:
   a plurality of first current sources that are weighted depending on lower-order bits of digital input signals and supplied with a first bias voltage;
   a plurality of second current sources that are weighted depending on higher-order bits of the digital input signals and supplied with a second bias voltage;
   a reference current source circuit configured to generate the first bias voltage and the second bias voltage based on a first reference current;
   an output circuit configured to combine currents from the first current sources and currents from the second current sources in accordance with the digital input signals to generate an output current, the currents from the first current sources and the currents from the second current sources being set according to the first reference current;

a temperature detection circuit configured to output a temperature detection signal depending on a temperature; and a correction circuit configured to change the first reference current supplied to the reference current source circuit into a second reference current set based on the temperature detection signal and adjust the first bias voltage and the second bias voltage based on the currents from the first current sources and the second current sources changed according to the second reference current.

7. The digital-to-analog conversion circuit according to claim 6, wherein the reference current source circuit includes:

a reference transistor including a first current terminal, a second current terminal, and a control terminal, wherein the first current terminal is supplied with a power supply voltage;

a first resistor circuit coupled to the second current terminal of the reference transistor, wherein the first resistor circuit includes a plurality of resistors that are coupled in series to each other and is configured to generate a plurality of divided voltages at a plurality of nodes between the resistors, and the control terminal of the reference transistor is coupled to one of the plurality of nodes;

a first selection circuit including a plurality of switches, each of the switches including a first terminal coupled to the plurality of nodes and a second terminal coupled to the plurality of first current sources;

a second selection circuit including a plurality of switches, each of the switches including a first terminal coupled to the plurality of nodes and a second terminal coupled to the plurality of second current sources;

a plurality of second resistor circuits coupled to the second current terminal of the reference transistor, wherein each of the second resistor circuits has a resistance value that is equal to that of the first resistor circuit; and a plurality of switch circuits that are configured to couple each of the second resistor circuits in parallel to the first resistor circuit to divide the first reference current flowing through the reference transistor into the first resistor circuit and the plurality of second resistor circuits, and wherein the correction circuit is configured to control the plurality of switch circuits in accordance with the second reference current set based on the temperature detection signal and couple at least one of the plurality of second resistor circuits in parallel to the first resistor circuit to cause a current equal to the second reference current to flow through the first resistor circuit.

8. The digital-to-analog conversion circuit according to claim 7, wherein the control terminal of the reference transistor is coupled to an intermediate node of the plurality of nodes in the first resistor circuit.

9. The digital-to-analog conversion circuit according to claim 7, wherein the correction circuit includes:

a first correction current source configured to generate a current that is equal to a current generated by each of the second current sources;

a second correction current source configured to generate a current that is equal to a minimum current generated by one of the first current sources;

a first correction resistor coupled to the first correction current source;

a second correction resistor having a resistance value equal to that of the first correction resistor;

a comparator coupled to the first and second correction resistors; and a correction control circuit configured to control the switches of the first selection circuit and the switches of the second selection circuit in accordance with an output signal from the comparator, and wherein the correction control circuit is configured to adjust the first bias voltage by coupling the second correction current source and the first current sources to the second correction resistor and selectively turning on one of the switches of the first selection circuit in accordance with the output signal from the comparator, and adjust the second bias voltage by selectively coupling one of the second current sources to the second correction resistor and selectively turning on one of the switches of the second selection circuit in accordance with the output signal from the comparator.

10. The digital-to-analog conversion circuit according to claim 7, wherein the second selection circuit is one of a plurality of second selection circuits, each of the second selection circuits being coupled to one of the second current sources to output the second bias voltage supplied to the corresponding second current source, and the correction control circuit is configured to sequentially couple one of the second current sources to the second correction resistor and selectively turn on one of the switches of the second selection circuit corresponding to the second current source coupled to the second correction resistor so as to adjust the second bias voltage supplied to the second current source coupled to the second correction resistor.

11. A correction method for a digital-to-analog conversion circuit comprising:

generating a first bias voltage and a second bias voltage based on the first reference current by a reference current source circuit;

supplying the first bias voltage to a plurality of first current sources that are weighted depending on lower-order bits of digital input signals;

supplying the second bias voltage to a plurality of second current sources that are weighted depending on higher-order bits of the digital input signals;

combining currents from the first current sources and currents from the second current sources in accordance with the digital input signals to generate an output current, the currents from the first current sources and the currents from the second current sources being set according to the first reference current;

changing the first reference current supplied to the reference current source circuit into a second reference current smaller than the first reference current; and adjusting the first bias voltage and the second bias voltage based on the currents from the first current sources and the second current sources changed according to the second reference current.

12. A correction method for a digital-to-analog conversion circuit comprising:

generating a first bias voltage and a second bias voltage based on the first reference current by a reference current source circuit;

supplying the first bias voltage to a plurality of first current sources that are weighted depending on lower-order bits of digital input signals;

supplying the second bias voltage to a plurality of second current sources that are weighted depending on higher-order bits of the digital input signals;

combining currents from the first current sources and currents from the second current sources in accordance with the digital input signals to generate an output current, the currents from the first current sources and the currents from the second current sources being set according to the first reference current;

detecting a temperature of the digital-to-analog conversion circuit to generate a temperature detection signal;

changing the first reference current supplied to the reference current source circuit into a second reference current set based on the temperature detection signal; and adjusting the first bias voltage and the second bias voltage based on the currents from the first current sources and the second current sources changed according to the second reference current.

\* \* \* \* \*